(12) United States Patent
Alves Pereira et al.

(10) Patent No.: US 12,292,354 B2
(45) Date of Patent: May 6, 2025

(54) MODULAR STRUCTURE FOR FIXING RADIAL ELECTROMAGNETIC ACTUATORS FOR NON-DESTRUCTIVE TESTS AND FAILURE SIMULATIONS IN ROTATING MACHINES WITHOUT DISASSEMBLY OF BEARINGS

(71) Applicants: Petróleo Brasileiro S.A.—Petrobras, Rio de Janeiro (BR); Universidade Federal De Uberlândia—UFU, Uberlândia (BR)

(72) Inventors: Iago Alves Pereira, Uberlândia (BR); Raphael Timbo Silva, Rio de Janeiro (BR); Ademir Aparecido Cavalini, Jr., Uberlândia (BR); Túlio Torezan Silingardi Del Claro, Uberlândia (BR); Valder Steffen, Jr., Uberlândia (BR); Vergílio Torezan Silingardi Del Claro, Uberlândia (BR)

(73) Assignees: Petróleo Brasileiro S.A.—Petrobras, Rio de Janeiro (BR); Universidade Federal De Uberlândia—UFU, Uberlândia (BR)

( * ) Notice: Subject to any disclaimer, the term of this patent is extended or adjusted under 35 U.S.C. 154(b) by 231 days.

(21) Appl. No.: 17/985,518

(22) Filed: Nov. 11, 2022

(65) Prior Publication Data
US 2023/0152184 A1   May 18, 2023

(30) Foreign Application Priority Data

Nov. 12, 2021  (BR) ...................... 10 2021 022899 7

(51) Int. Cl.
*G01M 13/04*   (2019.01)
*G01R 31/34*   (2020.01)

(52) U.S. Cl.
CPC .......... *G01M 13/04* (2013.01); *G01R 31/343* (2013.01)

(58) Field of Classification Search
CPC ........................... G01M 13/04; G01R 31/343
USPC ...................................... 73/865.9
See application file for complete search history.

(56) References Cited

U.S. PATENT DOCUMENTS

| 4,942,321 A * | 7/1990 | Kanemitsu | F16C 32/0489 310/90.5 |
| 6,518,770 B2 * | 2/2003 | Childs | F16C 32/0444 324/545 |

FOREIGN PATENT DOCUMENTS

WO   WO-9704243 A1 *   2/1997   .......... F16C 32/0463

* cited by examiner

*Primary Examiner* — Nathaniel T Woodward
(74) *Attorney, Agent, or Firm* — Mintz, Levin, Cohn, Ferris, Glovsky and Popeo, P.C.

(57) ABSTRACT

The present invention discloses a modular structure for fixing radial electromagnetic actuators for non-destructive tests and failure simulations in rotating machines without disassembly of bearings and comprises the following components: ferromagnetic core (1), armature (4), cover (6), load cell (10), upper reinforcement (15), lower reinforcement (16), lower plate (17), side plate 1 (18), side plate 2 (19), upper plate (20), beam (7), spool (2), adjustment 1 (11), captive pin (3), chassis (5), lock (8), plate (9), adjustment 2 (13), captive screw (12), adjustment 3 (14).

15 Claims, 6 Drawing Sheets

MODULAR STRUCTURE FOR FIXING RADIAL ELECTROMAGNETIC ACTUATORS FOR NON-DESTRUCTIVE TESTS AND FAILURE SIMULATIONS IN ROTATING MACHINES WITHOUT DISASSEMBLY OF BEARINGS

CROSS-REFERENCE TO RELATED APPLICATION

This application claims priority to Brazilian Application No. 10 2021 022899 7, filed on Nov. 12, 2021, and entitled "MODULAR STRUCTURE FOR FIXING RADIAL ELECTROMAGNETIC ACTUATORS FOR NON-DESTRUCTIVE TESTS AND FAILURE SIMULATIONS IN ROTATING MACHINES WITHOUT DISASSEMBLY OF BEARINGS," the disclosure of which is incorporated herein by reference in its entirety.

FIELD OF THE INVENTION

The present invention is related to the area of testing in rotating machines to determine the mechanical properties of the rotor and/or bearings associated therewith.

DESCRIPTION OF THE STATE OF THE ART

Tests on rotating machines are normally carried out with the need of disassembling the bearings or damaging the shaft of the machine to be tested, altering its mechanical and vibration properties. An example is the simulation of a crack in a rotating machine shaft. For this, the equipment must be disassembled and its shaft must be artificially "cracked" by means of waterjet cutting, electrical discharge machining or laser cutting. A second example corresponds to the simulation of warping in rotating machines. For this test, the machine must be disassembled and its shaft bent by applying high bending loads to the same. Both examples cause changes in the mechanical properties of the equipment, since a process of disassembly/reassembly, or damage to the equipment is necessary, causing, for example, a change in the rigidity of the bearings or the shaft thereof. Thus, it is necessary to survey the mechanical properties of the equipment for the validation of numerical models of the machine to be studied. The absence of a non-destructive experimental test method, in the sense of not damaging and/or mischaracterizing the machine, justifies the creation of this system.

Document U.S. Pat. No. 6,518,770B2 discloses a system for measuring dynamic loads in a rotor-dynamic system, with a rotor that includes a magnetic bearing disposed around the rotor and with a plurality of magnets and at least one fiber optic strain gauge associated with a pole of a respective magnet. The fiber optic strain gauge is operable to detect a voltage at the respective pole resulting from dynamic loads. The strain gauge detected is indicative of dynamic loads.

The document "Desenvolvimento de um sistema de atuação magnética para excitação de sistemas rotativos (Development of a magnetic actuation system for excitation of rotating systems)—Ricardo Ugliara Mendes" discloses a finite element model of rotating machines integrated to the model of a magnetic actuator as a source of external excitation, focusing on the response of the model and its interaction with the actuator. A comparison between numerical simulations and practical tests obtained from an experimental bench is also presented.

The document "Desenvolvimento de um atuador magnético para excitação sem contato de sistemas rotativos (Development of a magnetic actuator for non-contact excitation of rotating systems)—Rogério Mendonca Furtado" discloses a practical experience and discussions on the development of the magnetic actuator used for tests in rotating machines. The influence of electric current, air gap, actuator pole surface and excitation frequency are presented. The magnetic force is estimated, based on the measurement of the magnetic flux density, measured by Hall sensors.

The anteriorities presented in the State of the Art are not capable of performing non-destructive tests on a rotating machine.

In view of the difficulties present in the above-mentioned State of the Art, for non-destructive testing solutions and failure simulations in rotating machines without disassembly of bearings, there is a need of developing a technology capable of performing effectively and that is in accordance with environmental and safety guidelines. The works presented do not have the unique features of this invention, which will be presented in detail below.

OBJECTIVE OF THE INVENTION

It is an objective of the invention to propose a mechanical system capable of performing non-destructive tests on rotating machines without any disassembly or damage to the same.

BRIEF DESCRIPTION OF THE INVENTION

The present invention discloses a modular structure for fixing radial electromagnetic actuators for non-destructive tests and failure simulations in rotating machines without disassembly of bearings and comprises the following components: ferromagnetic core (1), armature (4), cover (6), load cell (10), upper reinforcement (15), lower reinforcement (16), lower plate (17), side plate 1 (18), side plate 2 (19), upper plate (20), beam (7), spool (2), adjustment 1 (11), captive pin (3), chassis (5), lock (8), plate (9), adjustment 2 (13), captive screw (12), adjustment 3 (14).

BRIEF DESCRIPTION OF DRAWINGS

The present invention will be described in more detail below, with reference to the attached figures which, in a schematic way and not limiting the inventive scope, represent examples of embodiment of its accomplishment. In the drawings, there are.

DETAILED DESCRIPTION OF THE INVENTION

Figure 1:
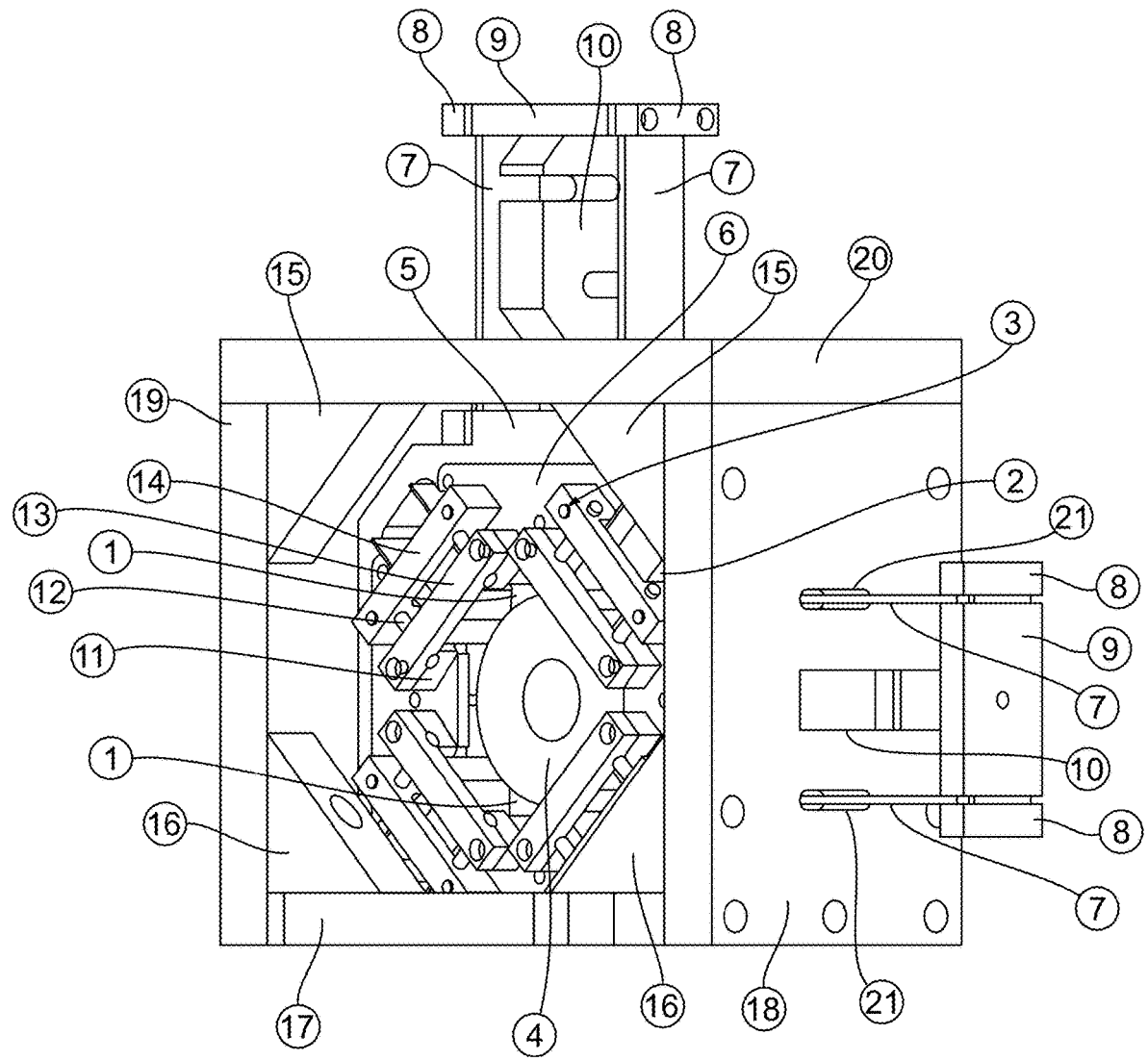
FIG. 1—Perspective view of the built complete equipment, in operating configuration.
Figure 2:
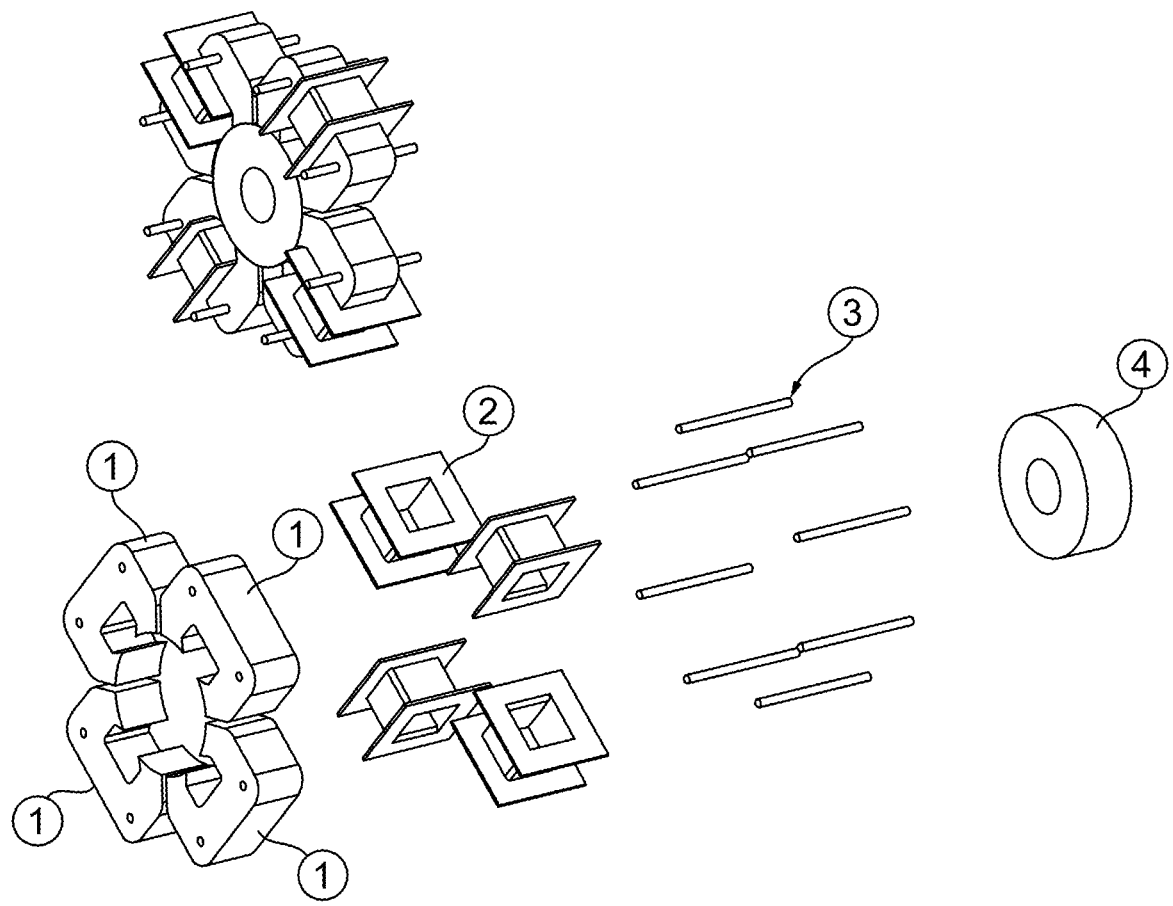
FIG. 2—Perspective view of active components, both in operating configuration and in exploded view for detailing the parts.
Figure 3:
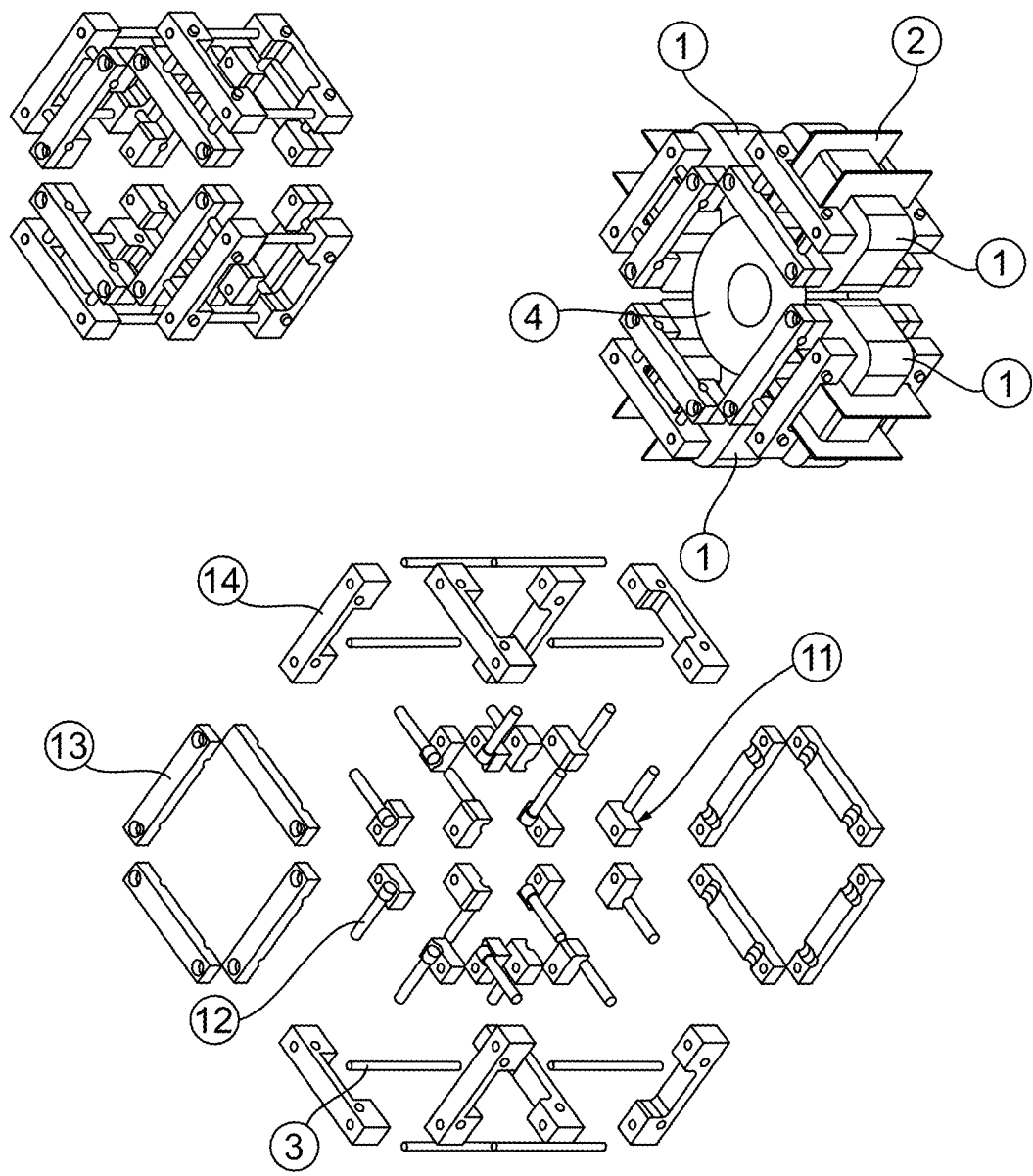
FIG. 3—Perspective view of the adjustment components, both in operation configuration and in exploded view for detailing the parts. There is also an assembly with the active components, showing the connection between the two systems.
Figure 4:
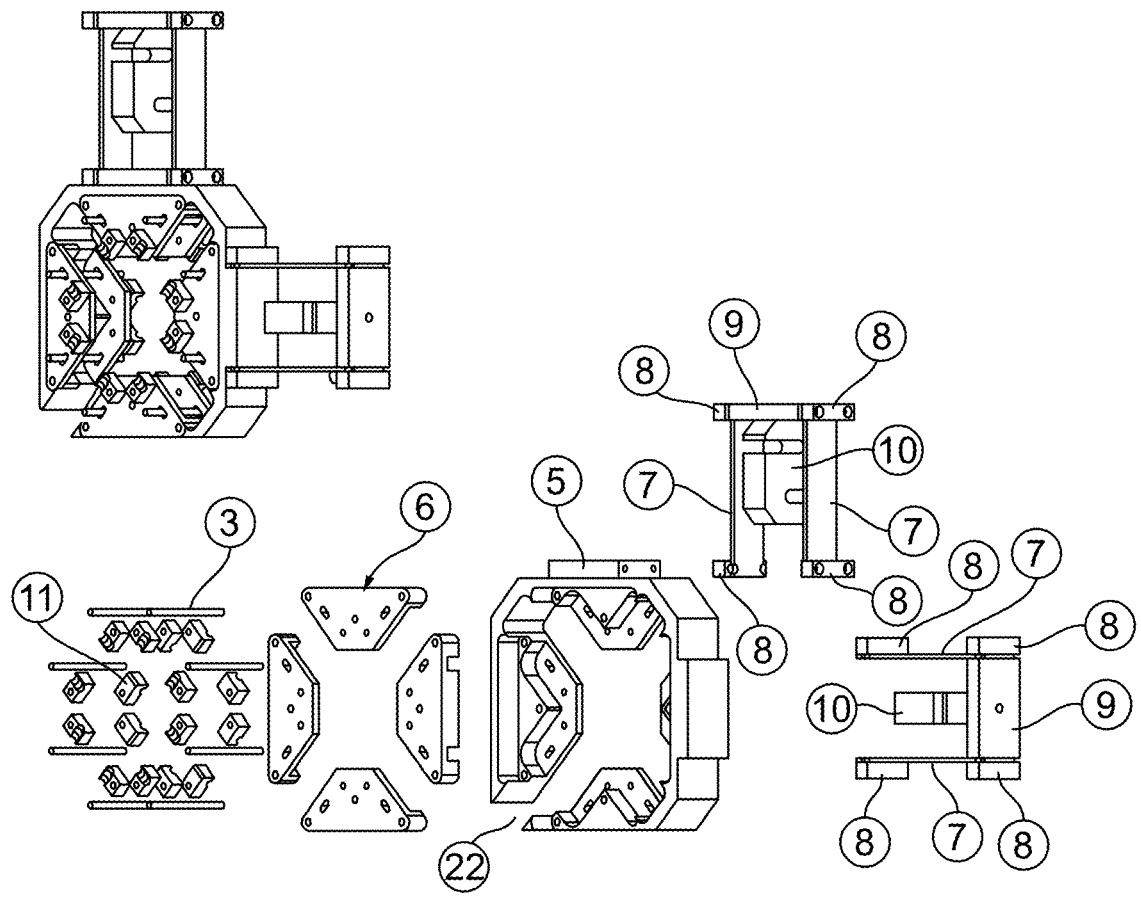
FIG. 4—Perspective view of the internal structure, both in operating configuration and in exploded view for detailing the parts. There is also an assembly with the adjustment components, showing the connection between the two systems.
Figure 5:
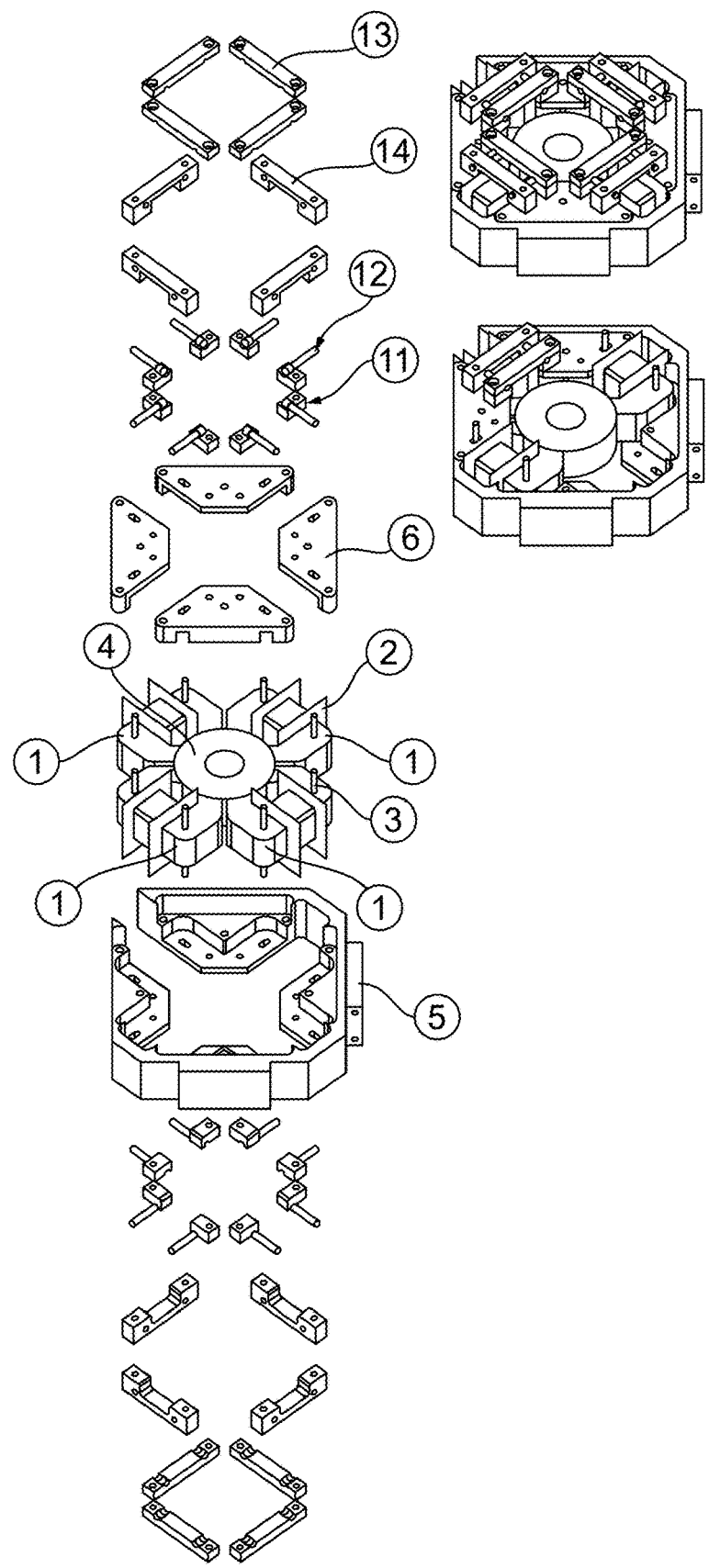
FIG. 5—Perspective view of the assembly of the internal structure, adjustment components and active components, both in operating configuration and in exploded view for detailing the parts.
Figure 6:
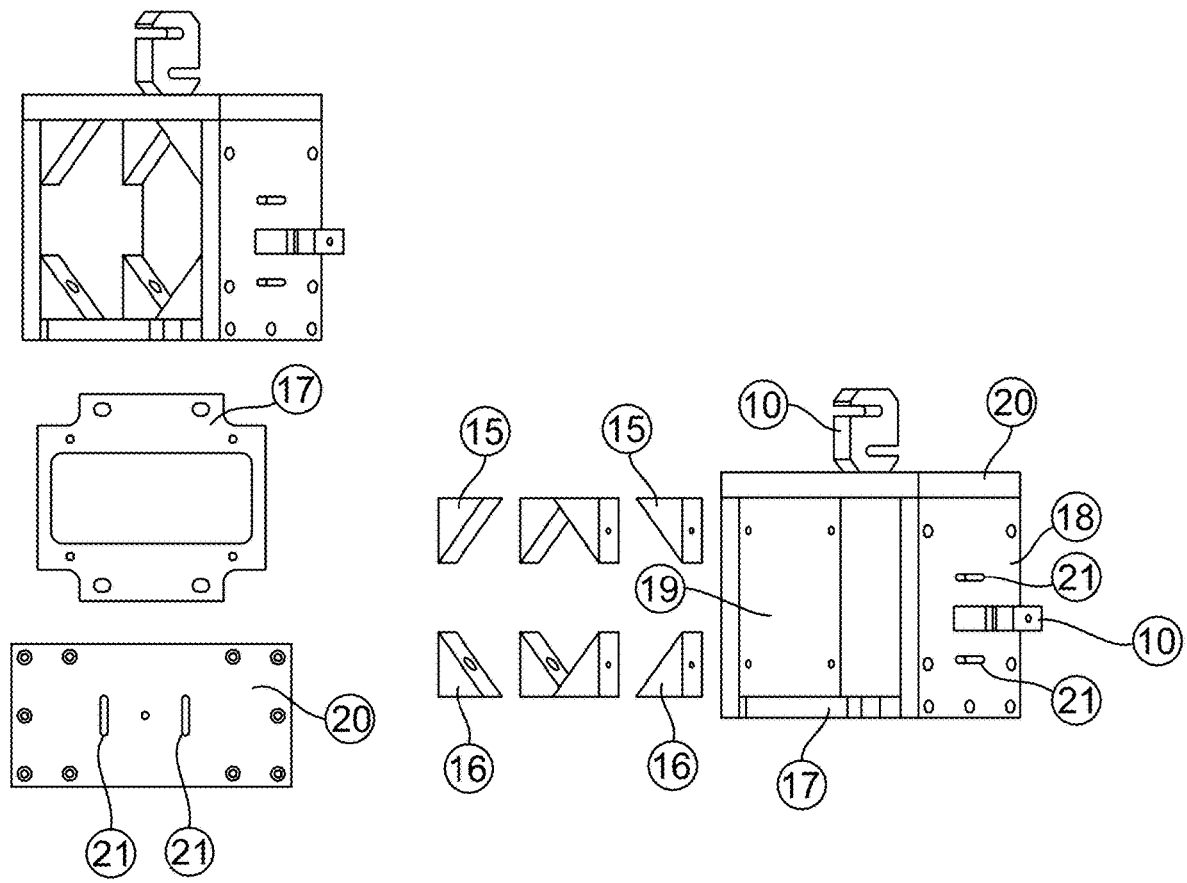
FIG. 6—Perspective view of the external structure, both in operating configuration and in exploded view for detailing the parts.

There follows below a detailed description of a preferred embodiment of the present invention, by way of example and in no way limiting. Nevertheless, it will become clear to a technician skilled on the subject, upon reading this description, possible further embodiments of the present invention still comprised by the essential and optional features below.

The destructive and generally unfeasible test is replaced by another one that is easy to apply, by means of the use of the equipment described below, associated with its electro-mechanical actuators. Therefore, the difficulty of performing some tests is eliminated by the application of this invention.

The present invention replaces an extensive test, with risk of catastrophic failure and generally unfeasible, with a non-destructive and short duration test. The mentioned test deals with the determination of mechanical properties and simulation of defects in any rotating machines.

The modular structure for fixing radial electromagnetic actuators for non-destructive testing and failure simulations in rotating machines without disassembly of bearings comprises the following components: ferromagnetic core (1), armature (4), cover (6), cell load (10), upper reinforcement (15), lower reinforcement (16), lower plate (17), side plate 1 (18), side plate 2 (19), upper plate (20), beam (7), spool (2), adjustment 1 (11), captive pin (3), chassis (5), lock (8), plate (9), adjustment 2 (13), captive bolt (12), adjustment 3 (14).

The assembly of these components is detailed in the figures at the end of the document. The proposed device is divided into 4 sets, with distinct and clear functions:
1. Active components—generate the electromagnetic forces applied to the machine shaft;
2. Adjustment components—allow positioning with fine angular and radial adjustment of the active components in relation to the internal structure;
3. Internal structure—keeps the active and adjustment components in their proper positions in relation to the machine shaft;
4. External structure—acts as a protection structure for the other components of the device proposed herein and as a reference position for the load cells.

The structure begins to be assembled by joining the active components with the internal structure. The device is partially mounted outside the machine to be studied, so that three ferromagnetic cores (1) are positioned on the chassis (5). After this process, the covers (6), of north and west positions, are mounted on the ferromagnetic cores (1) mounted on the chassis (5), and fastened by screws, which have their heads seated on the covers (6) and threaded into the chassis (5). Once this is done, the beams (7) are fixed to the chassis (5) by means of the locks (8). The load cells (10) are then screwed to the upper plate (20) and to the side plate 1 (18), which are positioned around the structure assembled in the previous step by means of the introduction of beams, previously fastened to the chassis (5), in the slots (21) in the upper plate (20) and side plate 1 (18). Then, the components of the internal structure are fixed to the upper plate (20) and side plate 1 (18) by means of load cells (10). The plates (9) are screwed to the load cells (10), and are fastened to the beams (7) by means of the locks (8).

Part of the external structure is mounted outside the machine. The side plate 1 (18), side plate 2 (19) and upper plate (20) are fixed together. The lower plate (17) is fixed to the rotating machine rail and the previously assembled set is positioned on the machine through the slot (22) present in the chassis (5). The lower plate (17) is fixed to the side plate 1 (18) and the side plate 2 (19) by means of a screw joint. The remaining ferromagnetic core (1), positioned at the location of the diagonal slot in the chassis, is assembled and the covers of south and east positions (6) are positioned over the ferromagnetic cores (1) and fastened to the chassis (5).

Adjustment components are positioned on the anterior portion of the chassis (5) and over the covers (6). First, adjustments 1 (11) are fixed. Captive screws (12) are threaded in adjustment 3 (14) and have their heads seated in the recess in adjustment 1 (11). Then, adjustment 2 (13) is positioned over the set of captive screws (12) and adjustments 1 (11), being then screwed to the chassis (5) and/or covers (6). Finally, the upper reinforcements (15) are fixed to the side plate 1 (18), side plate 2 (19) and the upper plate (20). The lower reinforcements (16) are fixed to side plate 1 (18), side plate 2 (19) and lower plate (17).

The invention claimed is:

1. A modular structure for fixing radial electromagnetic actuators, characterized in that it comprises a ferromagnetic core, an armature, covers, load cells, upper reinforcements, lower reinforcements, a lower plate, a side plate 1, a side plate 2, an upper plate, beams, a spool, an adjustment 1, a captive pin, a chassis, locks, plates, an adjustment 2, a captive screw, and an adjustment 3.

2. The modular structure according to claim 1, characterized in that three ferromagnetic cores are positioned on the chassis with the covers (6), of north and west positions, on the ferromagnetic cores.

3. The modular structure according to claim 1, characterized in that the beams are fixed to the chassis by means of the locks.

4. The modular structure according to claim 1, characterized in that one load cell is screwed to the upper plate and another load cell is screwed with the side plate 1.

5. The modular structure according to claim 4, characterized in that the upper and side 1 plates are positioned around the assembled structure by means of the introduction of the beams.

6. The modular structure according to claim 5, characterized in that the beams are fastened to the chassis through at least one slot of the upper plate and the side plate 1.

7. The modular structure according to claim 1, characterized in that the load cells fix components of the internal structure on the upper plate and side plate 1.

8. The modular structure according to claim 1, characterized in that the plates are screwed to the load cells and are fastened to the beams by means of the locks.

9. The modular structure according to claim 1, characterized in that the side plate 1, side plate 2 and upper plate are fixed together.

10. The modular structure according to claim 1, characterized in that the lower plate is fixed on a rotating machine rail.

11. The modular structure according to claim 10, characterized in that the lower plate is fixed on the side plate 1 and on the side plate 2 by means of a screw joint.

12. The modular structure according to claim 1, characterized in that covers of south and east position are positioned on the ferromagnetic cores and fastened to the chassis (5).

13. The modular structure according to claim 1, characterized in that the adjustment 1, the adjustment 2, and the adjustment 3 are positioned in an anterior portion of the chassis and on the covers.

14. The modular structure according to claim 1, characterized in that the upper reinforcements comprise first and second upper reinforcements, wherein the first upper reinforcement is fixed on the side plate 1 and the upper plate, and the second upper reinforcement is fixed on side plate 2 and on the upper plate.

15. The modular structure according to claim 1, characterized in that the lower reinforcements comprise first and second lower reinforcements, wherein the first reinforcement is fixed on the side plate 1 and the lower plate, and the second reinforcement is fixed, on the side plate 2 and on the lower plate.

* * * * *